United States Patent [19]
Torek et al.

[11] Patent Number: 5,685,951
[45] Date of Patent: Nov. 11, 1997

[54] METHODS AND ETCHANTS FOR ETCHING OXIDES OF SILICON WITH LOW SELECTIVITY IN A VAPOR PHASE SYSTEM

[75] Inventors: Kevin James Torek; Whonchee Lee, both of Boise; Richard C. Hawthorne, deceased, late of Nampa, all of Id.

[73] Assignee: Micron Technology, Inc., Boise, Id.

[21] Appl. No.: 601,787

[22] Filed: Feb. 15, 1996

[51] Int. Cl.$^6$ .................................................. H01L 21/311
[52] U.S. Cl. .................................. 156/646.1; 156/656.1; 156/657.1; 156/662.1; 437/228; 437/240; 252/79.1; 134/1.3
[58] Field of Search ........................ 156/646.1, 656.1, 156/657.1, 662.1; 134/1.3; 252/79.1; 437/228, 238, 240

[56] References Cited

U.S. PATENT DOCUMENTS

| | | | |
|---|---|---|---|
| 4,380,489 | 4/1983 | Beinvogl et al. | 156/657.1 |
| 5,022,961 | 6/1991 | Izumi et al. | 156/662.1 |
| 5,030,319 | 7/1991 | Nishino et al. | 216/87 |
| 5,173,152 | 12/1992 | Tanaka | 216/79 |
| 5,314,578 | 5/1994 | Cathey | 156/662.1 |
| 5,376,233 | 12/1994 | Man | 156/662.1 |
| 5,505,816 | 4/1996 | Barnes et al. | 437/225 |
| 5,571,375 | 11/1996 | Izumi et al. | 252/79.1 |

FOREIGN PATENT DOCUMENTS

| | | |
|---|---|---|
| 601532 A2 | 6/1994 | European Pat. Off. . |
| 8-195381 A2 | 7/1996 | Japan . |
| 8-264500 A2 | 10/1996 | Japan . |

OTHER PUBLICATIONS

Watanabe et al "Selective Etching of Phosphosilicate Glass with Low Pressure Vapor HF": J. Electrochem. Soc. vol. 142, (1) 237–243 Jan. 1995.

*Primary Examiner*—R. Bruce Breneman
*Assistant Examiner*—Anita Alanko
*Attorney, Agent, or Firm*—Workman, Nydegger & Seeley

[57] ABSTRACT

A surface having exposed doped silicon dioxide such as BPSG is cleaned with a vapor phase solution that etches thermal oxide at least one-third as fast as it etches the exposed doped silicon dioxide, resulting in more thorough cleaning with less removal of the exposed doped silicon dioxide. Specific applications to formation of container capacitors are disclosed. Preferred cleaning vapor phase solutions include about 1% water, about 5% hydrogen fluoride, and about 5% ammonia. The vapor phase solution is also useful in cleaning methods in which a refractory metal silicide is exposed to the cleaning vapor phase solution such as in cleaning prior to spacer formation or prior to a gate stack contact fill, in which case about 500 PPMV water, about 2% hydrogen fluoride, and about 2% ammonia is most preferred.

31 Claims, 4 Drawing Sheets

METHODS AND ETCHANTS FOR ETCHING OXIDES OF SILICON WITH LOW SELECTIVITY IN A VAPOR PHASE SYSTEM

BACKGROUND OF THE INVENTION

1. The Field of the Invention

The present invention relates to the manufacture of semiconductor devices. More particularly, the present invention is directed to methods employing vapor phase etchants for etching oxides of silicon during the manufacture of a semiconductor device such that the selectivity of the etchant is low. The methods of the present invention are also useful in removing contamination other than silicon oxides typically encountered in semiconductor manufacturing process flows, such as polymer residues, while providing low selectivity.

2. The Relevant Technology

In the continuing quest for ever denser DRAM devices, the problem of properly forming capacitors for each memory cell becomes increasingly acute. The problem is due to the need of providing both sufficiently large capacitance to preserve a charge between refresh cycles and sufficiently small size to allow further reductions in circuit dimensions. Dimensional tolerances in capacitor formation have thus tended to become a yield-limiting and density-limiting factor in DRAM devices.

Clean processes are a significant source of decreased dimensional control in the formation of capacitor structures. Removal of native oxides and other types of oxide contamination is required at various steps during capacitor formation. A short dip in a dilute solution of hydrofluoric acid (HF), such as a 100:1 volumetric ratio of water to 49% HF solution, is typically employed for this purpose. Problems arise because the dilute HF solution also significantly and even preferentially attacks doped silicon dioxide such as BPSG in which the capacitor structures are formed and defined, resulting in decreased control of critical dimensions associated with the capacitor. A less selective process is thus needed to remove native oxides and other types of oxide contamination during capacitor formation without excessively attacking doped silicon dioxide such as BPSG. As doped silicon dioxide is etched, an unacceptable level of residue can be built up.

When doped silicon dioxide, such as BPSG, is etched, HF and $H_2O$ accumulate on the surface of the BPSG to form $H_3PO_4$ and $P_2O_5$, the latter being from the phosphorous dopant in the BPSG. As the BPSG is etched, phosphoric acid is produced. This etching by-product is detrimental in that the phosphorous remains on the semiconductor wafer. Phosphorous on the semiconductor wafer can form crystals which can then flake off and cause particulate contamination, or cause problems with photolithography. Additionally, the phosphoric acid residue can diffuse into the BPSG and then later out-diffuse, depending on ambient conditions, so as to selectively cause corrosion should the out diffusion occur in the presence of a corrosion prone metal. Consequently, it is best to avoid phosphoric acid build up on the semiconductor wafer.

A dilute HF solution is also typically employed to remove native oxide or other oxide contamination at process steps during which a refractory metal silicide such as titanium silicide is exposed to the solution. This may occur, for example, in a clean step prior to the formation of spacers around a gate stack that includes a refractory metal silicide layer, or during a clean step prior to filling a contact to a gate stack that includes a refractory metal silicide. As dimensions of gate stacks decrease, this use of dilute HF solution creates problems because the refractory metal silicide layer is preferentially etched by the dilute HF solution, such that where dimensional tolerances are small, the refractory metal silicide layer may be seriously damaged or even completely destroyed. A less selective process is thus needed to remove native oxide and other types of oxide contamination during gate formation and contact formation without excessively attacking refractory metal silicides.

Wet etching processes use a large quantity of chemicals that require clean-up procedures incident to their use. In addition to consumption of water by wet etching processing, wet etching may also have a detrimental environmental impact. An economical etching process that avoids such problems know to wet etching would be desirable.

SUMMARY AND OBJECTS OF THE INVENTION

An object of the present invention is to provide a vapor etch method for removing native oxides and other types of oxide contamination during capacitor formation without excessively attacking doped silicon dioxide such as BPSG.

Another object of the present invention is to provide a vapor etch method for removing native oxides and other types of oxide contamination without excessively attacking refractory metal silicides such as titanium silicide.

Still another object of the present invention is to provide a vapor etch method for cleaning a surface having exposed doped silicon dioxide such as BPSG without removing significant amounts of the exposed doped silicon dioxide.

Still another object of the present invention is to provide a vapor etch method for cleaning a surface having an exposed refractory metal silicide such as titanium silicide without removing significant amounts of the exposed refractory metal silicide.

In accordance with one general embodiment of the present invention, a surface situated on a semiconductor wafer having exposed doped silicon dioxide is cleaned in an etching chamber by adding ammonia gas to a gaseous mixture of HF and water vapor, resulting in removal of oxide contamination or polymer residues with decreased erosion of the doped silicon dioxide.

In accordance with another general embodiment of the present invention, a surface situated on a semiconductor wafer having an exposed refractory metal silicide is cleaned in an etching chamber by adding ammonia gas to a gaseous mixture of HF and water vapor, resulting in removal of oxide contamination with decreased erosion of the refractory metal silicide. This general embodiment is particularly useful in cleaning gate stacks prior to spacer formation and in cleaning contacts including contacts to gate stacks prior to contact fill.

In accordance with a method of the present invention, a capacitor contact formed through a layer of doped silicon dioxide to an active area of a semiconductor substrate is cleaned in an etching chamber by adding ammonia gas to a gaseous mixture of HF and water vapor prior to the deposition of polysilicon to form a plate of a container capacitor. Use of the vapor etch to perform the capacitor contact clean decreases the amount of doped silicon dioxide removed by the capacitor contact clean, thereby reducing the likelihood of shorts between adjacent capacitors.

In accordance with another method of the present invention, a post-chemical mechanical polishing clean is performed to remove silica particles and other contamination remaining after isolation by chemical mechanical polishing (CMP) of polysilicon containers in doped silicon dioxide. An etching chamber has a controlled partial pressure of an ammonia gas added to a gaseous mixture of HF and water vapor, resulting in less erosion of the doped silicon dioxide, providing better process control and less likelihood of subsequent formation of stringers.

In accordance with yet another method of the present invention, a contact to an active area of a semiconductor substrate formed through a layer of doped silicon dioxide containing container capacitors is cleaned, prior to filling the contact, in an etching chamber by adding ammonia gas to a gaseous mixture of HF and water vapor. Use of the vapor etch clean reduces the removal of doped silicon dioxide during the clean, decreasing the likelihood of a short from the contact to a container capacitor.

These and other objects and features of the present invention will become more fully apparent from the following description and appended claims, or may be learned by the practice of the invention as set forth hereinafter.

BRIEF DESCRIPTION OF THE DRAWINGS

Understanding that these drawings depict only typical embodiments and applications of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

The present invention provides etchants having improved characteristics over typical wet etch dilute HF dips for various cleans used in the manufacture of semiconductor devices. A dilute wet etch HF dip has been widely used in the manufacture of semiconductor devices for many types of cleans requiring the removal of various oxides. These cleans include cleans for oxides such as thermal oxide and oxide contamination. Such oxide contamination includes native oxide and oxide residues from processes such as plasma etching. Improved etchant processes are needed, however, especially for the formation of structures having very small critical dimensions, such as the structures shown in FIGS. 1-5.

Figure 1:
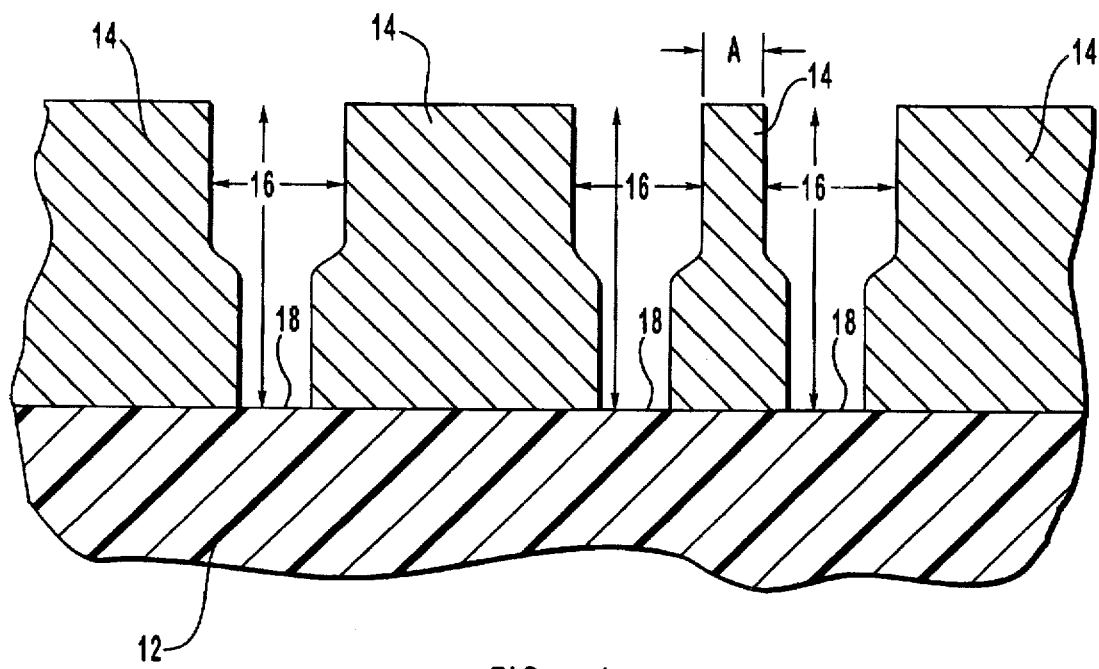
FIG. 1 is a partial cross section of a partially formed semiconductor device having spaces for container capacitors formed in a layer of BPSG.

FIG. 1 shows a cross section of a substrate 12, such as a silicon substrate situated on a semiconductor wafer, having formed thereon a layer of doped silicon dioxide 14 such as BPSG. Layer of doped silicon dioxide 14 has spaces 16 for container capacitors formed therethrough down to source/drain regions 18 defined in substrate 12.

Prior to deposition of a conductive layer over layer of doped silicon dioxide 14 and substrate 12 to form the container of a container capacitor, a clean step is performed to remove any remaining thermal oxide and native oxide or other oxide contamination at source/drain regions 18. Because of the close tolerances employed in high-density memory circuits, the distance A between closely grouped pairs of spaces 16 is quite small. If the clean step erodes layer of doped silicon dioxide 14 sufficiently, distance A between closely adjacent spaces will be reduced too much, resulting in shorting of adjacent capacitors.

To avoid this problem, the present invention utilizes a clean step in which the rate of removal of unwanted oxide, such as thermal oxide or oxide contamination, is much increased relative to the rate of removal of layer of doped silicon dioxide 14, when compared with the typical wet etch in a dilute HF dip. For example, a wet etch of dilute HF (100:1) can remove layer of doped oxide 14 at least nine (9) times the rate of removal of thermal oxide, while the vapor phase etch clean steps utilized in the present invention typically remove layer of doped oxide 14 less than or equal to three (3) times the rate of removal of thermal oxide. This allows sufficient cleaning for the subsequently deposited conductive layer to form a reliable contact to source/drain regions 18 without resulting in too great a decrease in distance A.

Figure 2:
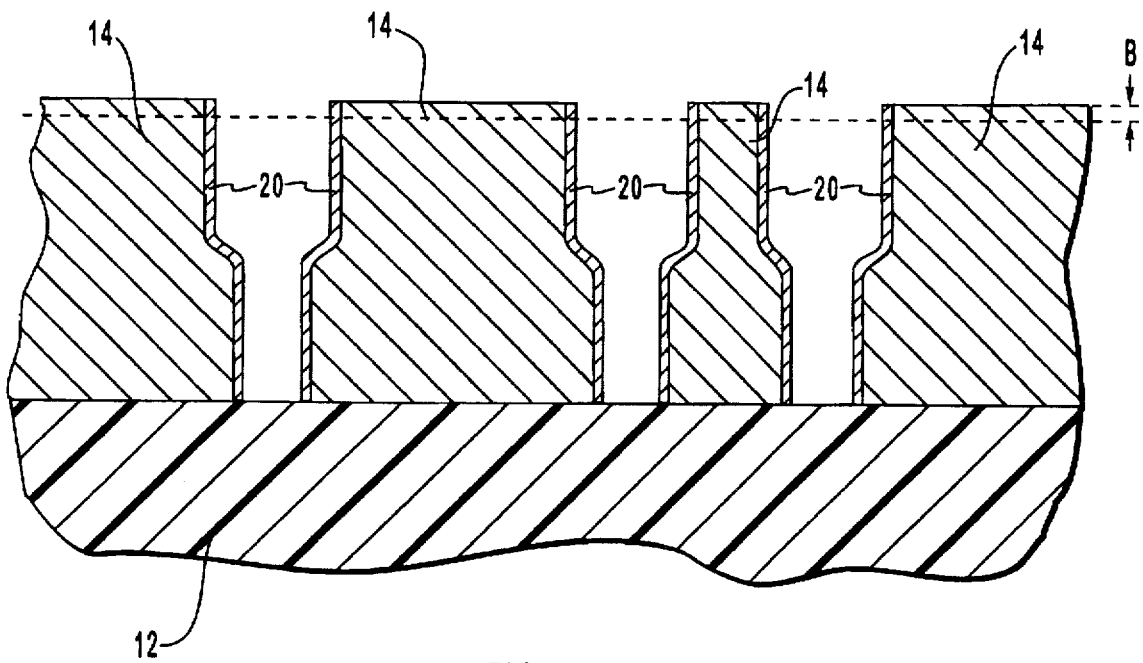
FIG. 2 is a cross section of the structure represented in FIG. 1 after deposition of a layer of a conducive material and chemical mechanical polishing.

FIG. 2 shows a cross section of the structure shown in FIG. 1 after further processing including deposition of a layer of conductive material such as polysilicon over layer of doped silicon dioxide 14 and substrate 12 and after removal of those portions of the layer of conductive material above the uppermost surface of layer of doped silicon dioxide 14. This results containers 20 of the conductive material formed within spaces 16.

The removal of those portions of the layer of conductive material above the uppermost surface of layer of doped polysilicon 14 is typically accomplished by chemical mechanical polishing (CMP). After polishing by CMP, a clean step is required to remove native oxide prior to forming the capacitor electrode. This clean step is typically a dilute HF dip. While the dilute HF dip does not significantly etch containers 20, layer of doped silicon dioxide 14 is etched to a depth illustrated in FIG. 2 as depth B from the uppermost surface of layer of silicon dioxide 14. Since containers 20 are not etched by the clean step, removal of layer of doped silicon dioxide 14 to depth B results in a stepped profile at containers 20. If depth B is sufficiently large, the resulting stepped profile at containers 20 can cause stringers and other problems in subsequent capacitor layers, resulting in shorts and circuit failures.

The present invention avoids this problem by employing a vapor phase etch clean step after CMP in which the rate of removal of native silicon oxides and other contamination is much increased relative to the rate of removal of layer of doped silicon dioxide 14, when compared with the typical dilute HF dip. This results in a reduction of depth B such that stringers and other subsequent problems are less likely to occur. This vapor phase etch clean step may also be beneficially employed at any other process point at which a surface polished by CMP has both silicon or polysilicon and silicon dioxide exposed.

Figure 3:
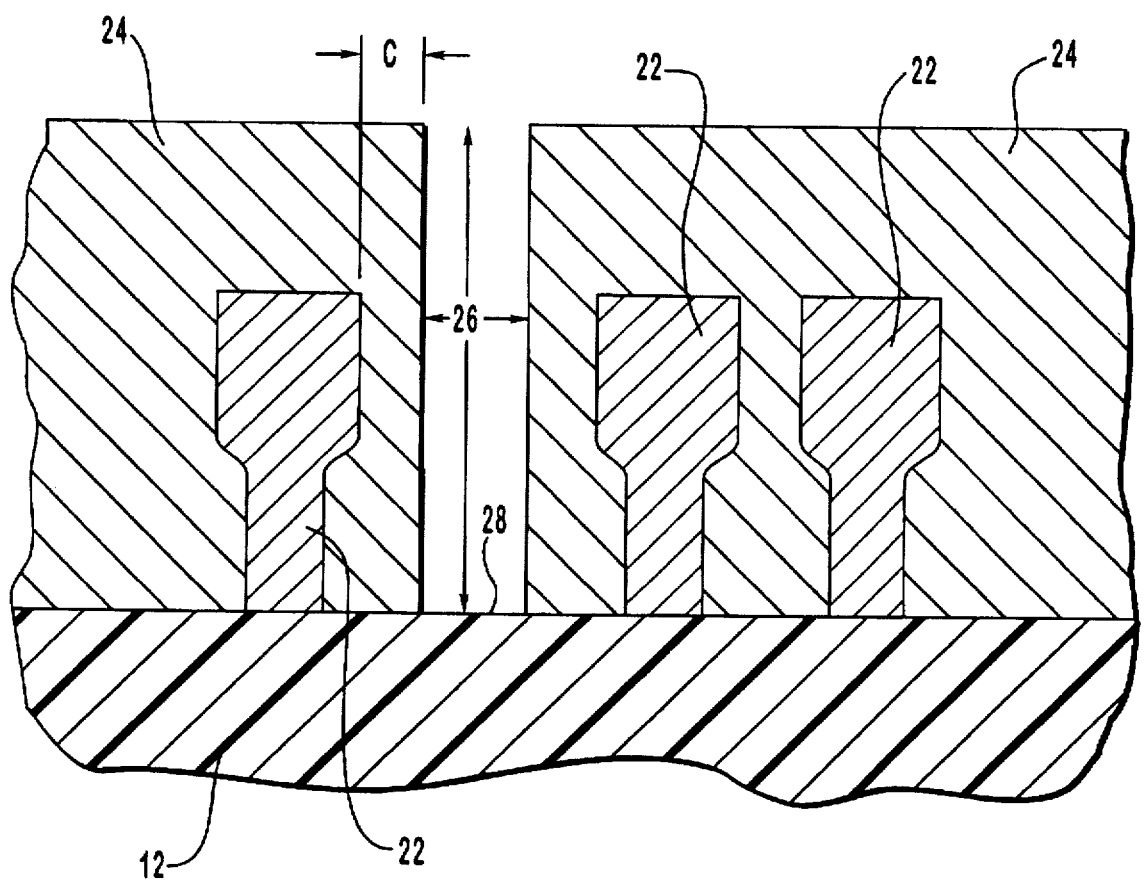
FIG. 3 is a cross section of the structure represented in FIG. 2 after further processing.

FIG. 3 is a cross section of the structure shown in FIG. 2 after further processing including completion of container capacitors 22 and at least one additional deposition of doped silicon dioxide, resulting in a layer 24 of doped silicon dioxide comprised of multiple layers of doped silicon dioxide. A contact hole 26 has been formed in layer 24 down to substrate 12. Prior to filling contact hole 26, a clean step is required to remove unwanted native oxide and any other oxide contamination from a contact area 28 to insure formation of a reliable, low resistance contact. This clean step is typically a dilute HF dip. The dilute HF dip, in addition to removing contamination from contact area 28, removes a portion of layer 24, resulting in a decrease in a distance C from the edge of contact hole 26 to the edge of one of container capacitors 22. If distance C becomes sufficiently small, the conductive material subsequently used to fill contact hole 26 will short to a nearby one of container capacitors 22, resulting in circuit failure.

The present invention avoids this problem by employing a vapor phase etch clean step in which the rate of removal of native oxide and other oxide contamination at contact area 28 is much increased relative to the rate of removal of layer 24, when compared with the typical dilute HF dip. This results in a maximization of distance C, such that shorts between a contact subsequently formed in contact hole 26 and container capacitors 22 are 22 less likely to occur, and a high aspect ratio can be maintained by preventing etching of layer 24 laterally.

In accordance with the present invention, the clean step used in the methods described above with respect to FIGS. 1-3 is a vapor phase cleaning solution in an etcher which etches thermal oxide at least one-third the rate of a doped silicon dioxide such as BPSG, and preferably at least one-half that rate. A typical dilute HF dip etches thermal oxide at only one-ninth or less the rate of doped silicon dioxide such as BPSG. The increased etch rates of thermal oxide relative to doped silicon dioxide such as BPSG of the vapor phase cleaning solutions utilized in the present invention result in an increased removal of thermal oxide and native oxide and other oxide contaminants, as well as a decreased removal of the doped silicon dioxide such as BPSG.

Figure 6:
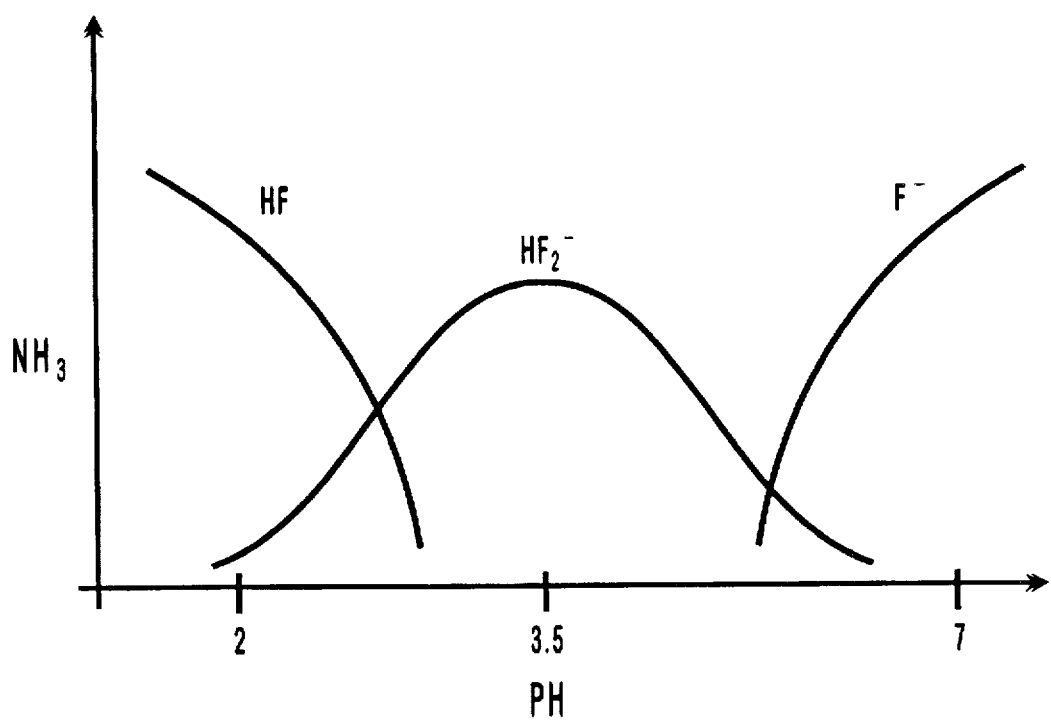
FIG. 6 is a graph of species concentration plotted against the pH of a vapor etch showing three separate dominant etch species.

The preferred vapor phase cleaning solution for use with the above methods is produced in an etch chamber. The partial pressure of an ammonia gas added to gaseous HF and water vapor in the chamber of the etcher is controlled. As the partial pressure of the ammonia gas in the chamber is controlled, the speciation of etchants on oxide surfaces being etched is also controlled. Stated otherwise, as the partial pressure of gaseous ammonia in the etcher is increased, the dominant etching species for oxide changes. The partial pressure change induces a pH change within the etcher such that the dominant etching species changes. As can be seen in FIG. 6, at a pH of about 2, the dominate etching species of oxide is HF. At a pH of about 3.5, the dominate etching species of oxide is $HF_2^-$, and at a pH of about 7, the dominate etching species of oxide is $F^-$. The ionic dependent pH will dictate the most active species which is causing the oxide to be etched.

In controlling the partial pressure of gaseous ammonia with respect to gaseous HF and water vapor in the etcher, reactions therebetween form barriers over the surfaces of the semiconductor wafer which tend to buffer the etch rate. The etch rate slows down such that the etch rate of BPSG to thermal oxide goes from 10:1 down to about 2:1 in the preferred vapor phase etch.

Figure 7:
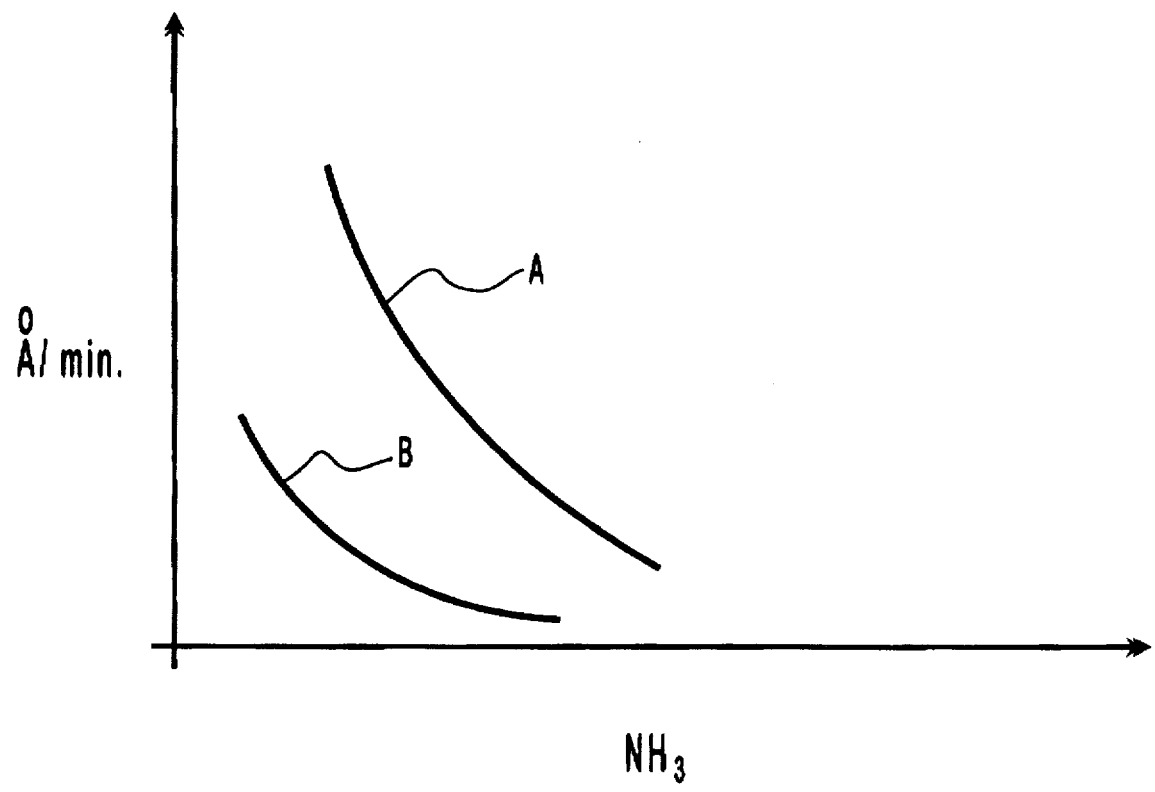
FIG. 7 is a graph of etch rate for BPSG and thermal oxide plotted against gaseous ammonia concentration.

As can be seen in FIG. 7, etch rate in Å per second is plotted against concentration of gaseous ammonia ($NH_3$) in the etcher. As ammonia partial pressure is added, ammonia is absorbed in the water vapor in the etcher. A result is achieved of having a lower etch rate of BPSG and thermal oxide, while the etching selectivity between BPSG and thermal oxide is decreased. When the partial pressure of gaseous ammonia is controlled in the etcher, the BPSG etch rate descends as does the thermal oxide etch rate coming down, but the BPSG etch rate decreases with a steeper slope. This result occurs as the pH in the etcher approaches the neutral pH of water. Consequently, the selectivity of the etch rate ratio between BPSG and thermal oxide approaches about 2:1, instead of the prior art dilute HF dip of a ratio of about 10:1.

Preferred process parameters for etching BPSG (6% phosphorous and 3% boron) at a rate of about 60 Angstroms/minute, and thermal oxide at a rate of about 30 Angstroms/minute, by way of example, are 500 sccm etch initiator carrier gas (i.e. $H_2O$, $CH_3OH$, $C_3H_6O$, $C_3H_8O$, etc.), 100 sccm HF, 30° C., 200 Torr, total pressure, and 100 sccm $NH_3$. This is a considerable improvement over standard dilute (100:1) HF dips, which exhibits about the same etch rate for thermal oxide but etches BPSG (6% phosphorous and 3% boron) at a rate of about 300 Angstroms/minute or more. This vapor phase cleaning method thus provides nearly a five-fold decrease in the ratio of BPSG etch rate to thermal oxide etch rate, as compared with 100:1 for a dilute HF dip. This cleaning solution is also useful to remove post etch/post ash residues, which can be removed in as little as 20 seconds in a preceding oxidative process, which may be done in-situ, followed by the removal of the contamination oxide produced from that step.

The forgoing preferred vapor phase cleaning solution is also useful in cleaning a surface that includes a refractory metal silicide, such as titanium silicide. While the ratios disclosed above for the preferred cleaning solution may be used, the most preferred ratios are 500 sccm initiator carrier gas (i.e. $H_2O$, $CH_3OH$, $C_3H_6O$, $C_3H_8O$, etc.), 100 sccm HF, 100 seem $NH_3$, 40 Torr total pressure, and 24° C. This solution will etch thermal oxide at about 21 Angstroms/minute and titanium silicide at about 40 Angstroms/minute, compared to titanium silicide etch rates as high as 1000 Angstroms/minute or more in 100:1 HF wet clean dip. Useful methods for applying the preferred cleaning solution in cleaning a surface including an exposed refractory metal silicide are illustrated in FIGS. 4 and 5.

Figure 4:
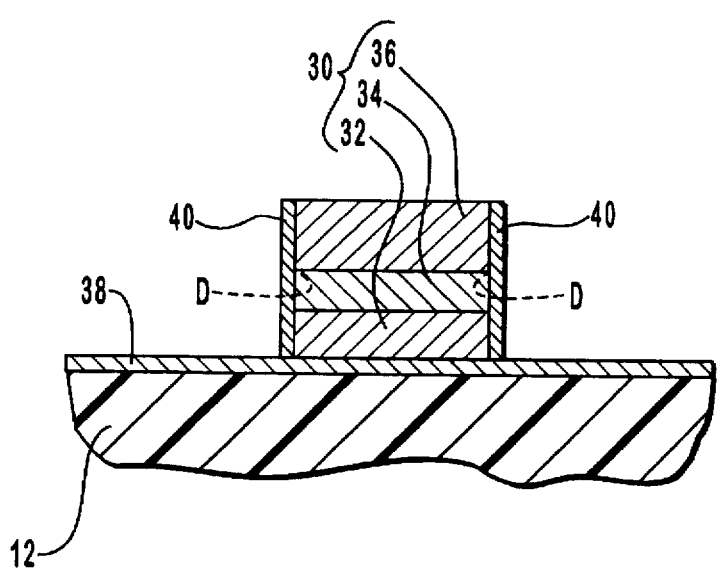
FIG. 4 is a partial cross section of a partially completed semiconductor device including a gate stack around which spacers are to be formed.

FIG. 4 shows a substrate 12 upon which a gate stack 30 has been formed including a polysilicon gate 32, a refractory metal silicide layer such as a titanium silicide layer 34, and a dielectric layer 36. Thermal oxide layer 38 overlies substrate 12. A thin oxide layer 40 encloses gate stack 30. Thin oxide layer 40 is produced during a plasma etch step previously used to define gate stack 30. Thin oxide layer 40 must be removed before deposition of a layer of spacer material to form spacers enclosing gate stack 30 in order that uniform, high quality spacers can be reliably formed. Removal of thin oxide layer 40 is typically accomplished with a 100:1 HF dip, creating a problem with deterioration of titanium silicide layer 34 as thin oxide layer 40 is removed, exposing the laterally facing surfaces of titanium silicide layer 34 to the HF dip solution. Titanium silicide layer 34 is then removed at the edges thereof such as at the areas shown for example by dotted lines D, resulting in increase of resistance of the structure and in malformed spacers surrounding gate stack 30. Use of the second preferred etchant above greatly reduces such deterioration during removal of thin oxide layer 40.

Figure 5:
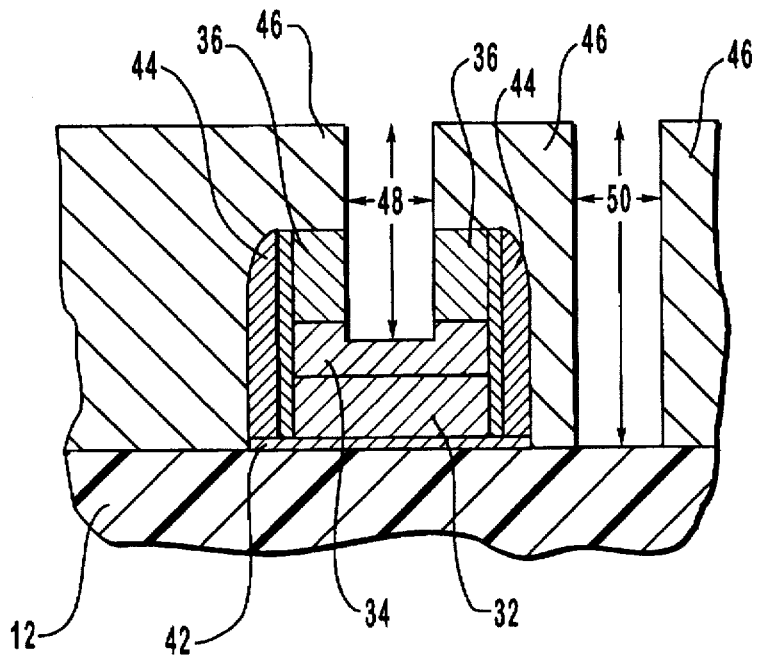
FIG. 5 is a partial cross section of a partially completed semiconductor device including a gate stack to which a contact is to be formed.

FIG. 5 shows a substrate 12 upon which a gate stack has been formed including a gate oxide 42, a polysilicon gate 32, a titanium silicide layer 34, and a dielectric layer 36. The gate stack is enclosed by spacers 44. A layer of doped silicon dioxide 46, such as BPSG, has been deposited over substrate 12 and the gate stack thereon, and contact holes 48, 50, have been formed therein downward to titanium silicide layer 34 and substrate 12, respectively. A clean step is then required before filling contact holes 48, 50 to form contacts to titanium silicide layer 34 and substrate 12. If the typical 100:1 HF dip is used, severe erosion and even complete etch-through of titanium silicide layer 34 can result which causes an increase in contact resistance. Use of the preferred etchant specified above allows a thorough clean of the portion of substrate 12 at the bottom of contact hole 50 without significantly eroding titanium silicide layer 34.

The inventive vapor phase etching methods can be either single wafer or batch processing. Vapor phase cleaning use less quantities of chemicals, require less clean-up procedure, and consume less water than wet etching processing. Thus, environmental and economical benefits are realized by the inventive vapor phase etching methods.

Vapor phase solutions for cleaning exposed doped silicon dioxide, as disclosed above, are as follows:

1. in the range of about 0.01 to $10^4$ PPMV initiator gas, about $10^3$ to $2 \times 10^5$ PPMV hydrogen fluoride, and about $10^3$ to $2 \times 10^5$ PPMV ammonia;
2. about 100 PPMV initiator gas, about 5% hydrogen fluoride, and about 4.5% ammonia; and
3. about 1% water, about 5% hydrogen fluoride, and about 5% ammonia.

Vapor phase solutions for cleaning exposed refractory metal silicide, as disclosed above, are proposed as follows:

1. in the range of about 0.01 to $10^4$ PPMV initiator gas and about 1,000 to $10^4$ PPMV hydrogen fluoride, and about 1,000 to $10^4$ PPMV ammonia;
2. about 500 PPMV initiator gas, about 2% hydrogen fluoride, and about 2% ammonia; and
3. about 500 PPMV water, about 2% hydrogen fluoride, and about 2% ammonia is most preferred.

Vapor phase solutions for cleaning exposed doped silicon dioxide and exposed silicon, as disclosed above, are proposed as follows:

1. in the range of about 0.01 to $10^4$ PPMV water, about 2% to 20% hydrogen fluoride, and about 2% to 20% PPMV ammonia; and
2. about 1% water, about 2% hydrogen fluoride, and about 2% ammonia.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A method for cleaning a surface having exposed doped silicon dioxide, said method comprising:

forming a surface situated on a semiconductor substrate, said surface having exposed doped silicon dioxide; and cleaning said surface with said exposed doped silicon dioxide in a vapor phase solution comprising in the range of about 0.01 to $10^4$ PPMV initiator gas, about $10^3$ to $2 \times 10^5$ PPMV hydrogen fluoride, and about $10^3$ to $2 \times 10^5$ PPMV ammonia, wherein said vapor phase solution etches thermal oxide at least one-half the rate at which said vapor phase solution etches said doped silicon dioxide.

2. The method as defined in claim 1 wherein said vapor phase solution comprises about 100 PPMV initiator gas and about 5% hydrogen fluoride and about 4.5% ammonia.

3. The method as defined in claim 1, wherein said vapor phase solution further comprises about 1% water, about 5% hydrogen fluoride, and about 5% ammonia.

4. The method as defined in claim 1, wherein said vapor phase solution etches thermal oxide at least one-third the rate at which said vapor phase solution etches said doped silicon dioxide.

5. The method as defined in claim 1 wherein said doped silicon dioxide comprises BPSG.

6. A method for cleaning surfaces, said method comprising:

forming a first surface situated on a semiconductor substrate, said first surface having exposed doped silicon dioxide;

forming a second surface situated on a semiconductor substrate, said second surface having exposed refractory metal silicide;

forming a third surface situated on a semiconductor substrate, said third surface having exposed thermal oxide; and cleaning said first, second, and third surfaces with a vapor phase solution comprising initiator gas, hydrogen fluoride, and ammonia, and wherein said exposed refractory metal silicide is not substantially etched wherein said vapor phase solution removes thermal oxide at least one-half the rate at which said vapor phase solution removes said doped silicon dioxide and said exposed refractory metal silicide is not substantially removed.

7. The method as defined in claim 6, wherein said vapor phase solution comprises about 500 PPMV initator gas, about 2% hydrogen fluoride, and about 2% ammonia.

8. The method as defined in claim 6, wherein said vapor phase solution etches thermal oxide at least one-half the rate at which said vapor phase solution etches the refractory metal silicide.

9. The method as defined in claim 6, wherein said refractory metal silicide comprises titanium silicide.

10. A method for providing containers for container capacitors having reliable contact to a silicon substrate, said method comprising the steps of:

(a) providing a silicon substrate situated on a semiconductor wafer, said silicon substrate having a layer of doped silicon dioxide formed thereover, said substrate having a source/drain region defined therein;

(b) forming in said layer of doped silicon dioxide a space for a container capacitor extending down through said layer of doped silicon dioxide to said source/drain region;

(c) cleaning said source/drain region in a vapor phase solution having an etch rate for thermal oxide of at least one-half of the etch rate of said vapor phase solution for said layer of doped silicon dioxide with an initiator gas, hydrogen fluoride and ammonia;

(d) depositing a layer of conductive material conformably over said silicon substrate and said layer of doped silicon dioxide to contact said source/drain region; and (e) removing said layer of conductive material from the top thereof downward to at least the topmost surface of said layer of doped silicon dioxide, leaving in said space a layer for a container capacitor formed of said conductive material.

11. The method as defined in claim 10, wherein said vapor phase solution has an etch rate for thermal oxide of at least one-third of the etch rate of said vapor phase solution for said layer of doped silicon dioxide.

12. The method as defined in claim 10, wherein said vapor phase solution comprises in the range of about 0.01 to $10^4$ PPMV initiator gas, about 2% to 20% hydrogen fluoride, and about 2% to 20% ammonia.

13. The method as defined in claim 10, wherein said vapor phase solution comprises about 1% water, about 5% hydrogen fluoride, and about 5% ammonia.

14. The method as defined in claim 10, wherein said layer of doped silicon dioxide comprises BPSG.

15. The method as defined in claim 10, wherein said conductive material comprises polysilicon.

16. A method for performing a clean of a surface situated on a semiconductor substrate, said surface having exposed doped silicon dioxide and exposed silicon, said method comprising:

providing a silicon substrate of a semiconductor substrate, said silicon substrate having exposed on a surface thereof both doped silicon dioxide and silicon, said surface having been polished by chemical mechanical polishing; and cleaning said surface after completion of the chemical mechanical polishing thereof in a vapor phase solution having an etch rate for thermal oxide of at least one-half of the etch rate of said vapor phase solution for said layer of doped silicon dioxide, wherein said vapor phase solution comprises in the range of about 0.01 to $10^4$ PPMV initiator gas, about 2% to 20% hydrogen fluoride, and about 2% to 20% PPMV ammonia, whereby said doped silicon dioxide is not substantially etched.

17. The method as defined in claim 16, wherein said vapor phase solution has an etch rate for thermal oxide of at least one-third of the etch rate of said vapor phase solution for said layer of doped silicon dioxide.

18. The method as defined in claim 16, wherein said vapor phase solution further comprises about 1% water, about 5% hydrogen fluoride, and about 5% ammonia.

19. The method as defined in claim 16, wherein said vapor phase solution comprises about 1% water, about 2% hydrogen fluoride, and about 2% ammonia.

20. The method as defined in claim 16, wherein said doped silicon dioxide comprises BPSG.

21. The method as defined in claim 16, wherein said silicon comprises polysilicon.

22. The method as defined in claim 21, wherein said polysilicon comprises polysilicon containers for container capacitors.

23. The method as defined in claim 1, further comprising:

forming secondary surfaces situated on a semiconductor substrate having exposed thereon one of refractory metal silicide and thermal oxide;

wherein cleaning said surface with said exposed doped silicon dioxide in said vapor phase solution further comprises exposing said secondary surfaces to said vapor phase solution, and wherein said exposed refractory metal silicide is not substantially etched.

24. The method as defined in claim 16, further comprising:

forming secondary surfaces situated on a semiconductor substrate having exposed thereon one of refractory metal silicide and thermal oxide;

wherein cleaning said surface with said exposed doped silicon dioxide in said vapor phase solution further comprises exposing said secondary surfaces to said vapor phase solution, and wherein said exposed refractory metal silicide is not substantially etched.

25. The method as defined in claim 1, wherein said initiator gas is substantially composed of a material selected from a group consisting of $H_2O$, $CH_3OH$, $C_3H_6O$, and $C_3H_8O$.

26. The method as defined in claim 6, wherein said initiator gas is substantially composed of a material selected from a group consisting of $H_2O$, $CH_3OH$, $C_3H_6O$, and $C_3H_8O$.

27. The method as defined in claim 16, wherein said initiator gas is substantially composed of a material selected from a group consisting of $H_2O$, $CH_3OH$, $C_3H_6O$, and $C_3H_8O$.

28. A method of removing materials situated on a conductor substrate comprising:

forming a first surface situated on a semiconductor substrate, said first surface having exposed doped silicon dioxide;

forming a second surface situated on said semiconductor substrate, said second surface having exposed refractory metal silicide;

forming a third surface situated on said semiconductor substrate, said third surface having exposed thermal oxide; and exposing said first, second, and third surfaces to a vapor phase solution comprising in the range of about 0.01 PPMV to about $10^4$ PPMV initiator gas, about $10^3$ PPMV to about $2 \times 10^5$ PPMV hydrogen fluoride, and about $10^3$ PPMV to about $2 \times 10^5$ PPMV ammonia, wherein said vapor phase solution removes thermal oxide at least one-half the rate at which said vapor phase solution removes said doped silicon dioxide and said exposed refractory metal silicide is not substantially removed.

29. A method as defined in claim 28, wherein said vapor phase solution comprises about 1% water, about 5% hydrogen fluoride, and about 5% ammonia, whereby said doped silicon dioxide is not substantially removed.

30. The method as defined in claim 28, wherein said vapor phase solution has an etch rate for thermal oxide of at least one-third of the etch rate of said vapor phase solution for said layer of doped silicon dioxide.

31. The method as defined in claim 28, wherein said initiator gas is substantially composed of a material selected from a group consisting of $H_2O$, $CH_3OH$, $C_3H_6O$, and $C_3H_8O$.

* * * * *

UNITED STATES PATENT AND TRADEMARK OFFICE
CERTIFICATE OF CORRECTION

PATENT NO. : 5,685,951

DATED : Nov. 11, 1997

INVENTOR(S) : Kevin James Torek; Whonchee Lee; Richard C. Hawthorne

It is certified that error appears in the above-identified patent and that said Letters Patent are hereby corrected as shown below:

On the title page,
Item [56] Foreign Patent Documents, change "601532" to --601,532--

Col. 1, line 47, after "the" change "BPSG" to --$P_2O_5$--

Col. 2, line 14, after "problems" change "know" to --known--

Col. 4, line 18, after "is" change "much" to --greatly--

Col. 4, line 37, after "results" insert --in--

Col. 5, line 24, after "are" delete --22--

Col. 6, line 37, after "100" change "seem" to --sccm--

Col. 6, line 61, after "in" insert --an--

UNITED STATES PATENT AND TRADEMARK OFFICE
CERTIFICATE OF CORRECTION

PATENT NO. : 5,685,951

DATED : Nov. 11, 1997

INVENTOR(S) : Kevin James Torek; Whonchee Lee; Richard C. Hawthorne

It is certified that error appears in the above-identified patent and that said Letters Patent is hereby corrected as shown below:

Col. 7, line 16, after "cleaning" insert --methods--

Col. 7, line 61, after "substrate" delete period

Signed and Sealed this

Fifteenth Day of December, 1998

Attest:

BRUCE LEHMAN

*Attesting Officer*   *Commissioner of Patents and Trademarks*

UNITED STATES PATENT AND TRADEMARK OFFICE
CERTIFICATE OF CORRECTION

PATENT NO.  : 5,685,951
DATED       : Nov. 11, 1997
INVENTOR(S) : Kevin James Torek; Whonchee Lee; Richard C. Hawthorne It is certified that error appears in the above-identified patent and that said Letters Patent is hereby corrected as shown below:

Col. 9, line 34, change "20% PPMV" to --20%--

Signed and Sealed this

Seventh Day of December, 1999

Attest:

Q. TODD DICKINSON

*Attesting Officer*          Acting Commissioner of Patents and Trademarks